(12) United States Patent
Furukawa

(10) Patent No.: US 10,636,553 B2
(45) Date of Patent: Apr. 28, 2020

(54) SOFT MAGNETIC RESIN COMPOSITION AND SOFT MAGNETIC FILM

(71) Applicant: NITTO DENKO CORPORATION, Osaka (JP)

(72) Inventor: Yoshihiro Furukawa, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 236 days.

(21) Appl. No.: 15/532,334

(22) PCT Filed: Dec. 3, 2015

(86) PCT No.: PCT/JP2015/084050
§ 371 (c)(1),
(2) Date: Jun. 1, 2017

(87) PCT Pub. No.: WO2016/088849
PCT Pub. Date: Jun. 9, 2016

(65) Prior Publication Data
US 2017/0271062 A1    Sep. 21, 2017

(30) Foreign Application Priority Data

Dec. 4, 2014  (JP) ................................ 2014-245455
Dec. 2, 2015  (JP) ................................ 2015-235503

(51) Int. Cl.
| | | |
|---|---|---|
| *H01F 1/147* | (2006.01) | |
| *C08L 33/04* | (2006.01) | |
| *C08L 63/00* | (2006.01) | |
| *H05K 9/00* | (2006.01) | |
| *C08L 33/02* | (2006.01) | |
| *C08J 5/18* | (2006.01) | |
| *C08L 33/20* | (2006.01) | |
| *H01F 1/00* | (2006.01) | |
| *H01F 38/14* | (2006.01) | |
| *H01F 27/36* | (2006.01) | |

(52) U.S. Cl.
CPC ............ *H01F 1/14791* (2013.01); *C08J 5/18* (2013.01); *C08L 33/02* (2013.01); *C08L 33/04* (2013.01); *C08L 33/20* (2013.01); *C08L 63/00* (2013.01); *H01F 1/0027* (2013.01); *H05K 9/0075* (2013.01); *C08J 2333/20* (2013.01); *C08J 2461/06* (2013.01); *C08J 2461/14* (2013.01); *C08J 2463/00* (2013.01); *C08J 2463/04* (2013.01); *C08L 2205/03* (2013.01); *H01F 27/365* (2013.01); *H01F 38/14* (2013.01)

(58) Field of Classification Search
CPC .......... H01F 1/14791; H01F 1/22; H01F 1/28; C08J 5/18
See application file for complete search history.

(56) References Cited

U.S. PATENT DOCUMENTS

| | | | |
|---|---|---|---|
| 2011/0233811 A1 | 9/2011 | Blettner et al. | |
| 2016/0083626 A1* | 3/2016 | Ebe ........................... | H01F 1/37 324/207.17 |

FOREIGN PATENT DOCUMENTS

| | | | |
|---|---|---|---|
| CN | 1417264 A | | 5/2003 |
| CN | 102898786 A | | 1/2013 |
| EP | 2963529 | * | 1/2016 |
| EP | 2963529 A | | 1/2016 |
| EP | 2963658 | * | 1/2016 |
| EP | 2963658 A1 | | 1/2016 |
| JP | 2005-310952 A | | 11/2005 |
| JP | 2006-039947 A | | 2/2006 |
| JP | 2009-059752 | * | 3/2009 |
| JP | 2009-059752 A | | 3/2009 |
| JP | 2012-212790 A | | 11/2012 |
| JP | 2012-212791 A | | 11/2012 |
| JP | 2012-241151 A | | 12/2012 |
| JP | 2013-181166 A | | 9/2013 |
| JP | 2014-164562 A | | 9/2014 |
| WO | 2014/132879 A1 | | 9/2014 |
| WO | WO 2014/132879 | * | 9/2014 |
| WO | WO 2014/156254 | * | 10/2014 |
| WO | WO 2014/132700 | * | 9/2019 |

OTHER PUBLICATIONS

International Search Report Issued in PCT/JP2015/084050 dated Feb. 16, 2016.
Written Opinion Issued in PCT/JP2015/084050 dated Feb. 16, 2016.
European Search Report completed by European Patent Office dated Jun. 18, 2018 in connection with European Patent Application No. 15864917.8.
Office Action issued by Chinese Patent Office dated Jun. 12, 2018, in connection with Chinese Patent Application No. 201580065920.4.
International Preliminary Report on Patentability issued by WIPO dated Jun. 15, 2017, in connection with International Patent Application No. PCT/JP2015/084050.
Office Action issued by the China National Intellectual Property Administration dated May 21, 2019, in connection with corresponding Chinese Patent Application No. 201580065920.4.
Office Action issued by Chinese Patent Office dated Mar. 1, 2019, in connection with Chinese Patent Application No. 201580065920.4.
Notification of Reasons for Refusal issued by the Japanese Patent Office dated Jul. 16, 2019, in connection with Japanese Patent Application No. 2015-235503.

(Continued)

*Primary Examiner* — C Melissa Koslow
(74) *Attorney, Agent, or Firm* — Edwards Neils LLC; Jean C. Edwards, Esq.

(57) ABSTRACT

A soft magnetic resin composition contains flat soft magnetic particles, and a resin component containing an epoxy resin, a phenol resin, and an acrylic resin. The epoxy resin consists of only an epoxy resin having three or more functional groups, the phenol resin consists of only a phenol resin having three or more functional groups, and the content ratio of the acrylic resin in the resin component is 25 mass % or more.

9 Claims, 1 Drawing Sheet

(56) References Cited

OTHER PUBLICATIONS

Notification of Reasons for Refusal issued by the Taiwanese Patent Office dated Jul. 16, 2019, in connection with Taiwanese Patent Application No. 104140826.
Office Action, issued by the European Patent Office dated Sep. 11, 2019, in connection with European Patent Application No. 15864917.8.
Office Action, issued by the Taiwanese Patent Office dated Nov. 26, 2019, in connection with Taiwanese Patent Application No. 104140826.
Office Action, issued by the China National Intellectual Property Administration dated Dec. 30, 2019, in connection with corresponding Chinese Patent Application No. 201580065920.4.
Decision of Refusal which was issued by the Japanese Patent Office dated Mar. 3, 2020, in connection with Japanese Patent Application No. 2015-235503.

* cited by examiner

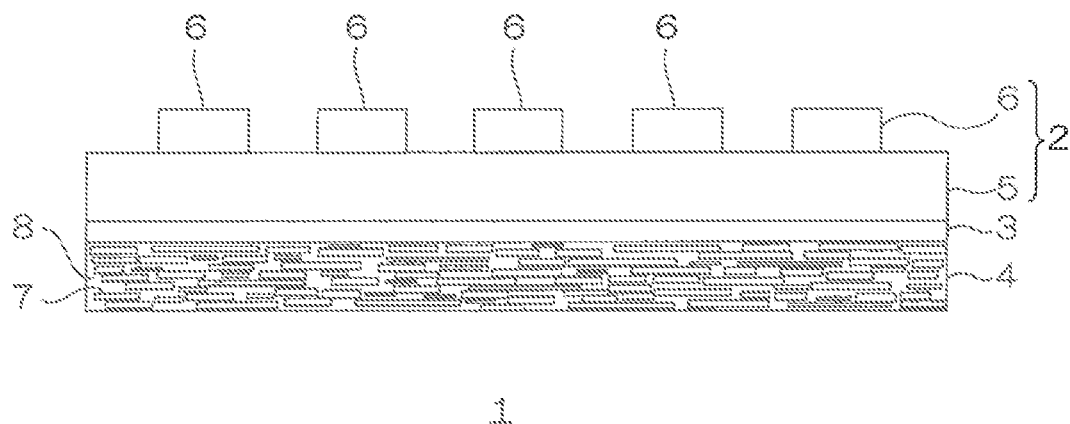

SOFT MAGNETIC RESIN COMPOSITION AND SOFT MAGNETIC FILM

CROSS-REFERENCE TO RELATED APPLICATIONS

The present application is a 35 U.S.C. 371 National Stage Entry of PCT/JP2015/084050, filed on Dec. 3, 2015, which claims priority from Japanese Patent Application No. 2014-245455, filed on Dec. 4, 2014, and 2015-235503, filed on Dec. 2, 2015, the contents of all of which are herein incorporated by reference in their entirety.

TECHNICAL FIELD

The present invention relates to a soft magnetic resin composition and a soft magnetic film obtained from the soft magnetic resin composition.

BACKGROUND ART

Recently, electronic devices such as personal computers and smartphones are equipped with functions of wireless communications and wireless power transmission. In electronic devices, for broadening distance of wireless communication, better efficiency, and a smaller size, a soft magnetic film for concentration of magnetic flux is disposed around an antenna or coil included in the electronic device (for example, see Patent Document 1).

Patent Document 1 discloses a flexible magnetic film formed by blending a flat soft magnetic powder with a binder.

Meanwhile, for improvement in efficiency of magnetic flux concentration, it is important to improve magnetic properties such as relative magnetic permeability (in particular, real part μ' of complex magnetic permeability). Generally, increasing the thickness of the magnetic film improves the shielding effect of the magnetic field. However, because a thin magnetic film and furthermore, a small-sized electronic device are demanded, it is difficult to meet the demand of a thinner thickness with the above-described method.

Thus, a method in which the content ratio of soft magnetic particles in a magnetic film is increased has been known (high filling) (for example, see Patent Document 2).

Patent Document 2 discloses an electromagnetic interference suppressor obtained by dispersing the soft magnetic powder to which a surface treatment is given by using a surface treatment agent containing Si elements in a binder.

CITATION LIST

Patent Document

Patent Document 1: Japanese Unexamined Patent Publication No. 2006-39947
Patent Document 2: Japanese Unexamined Patent Publication No. 2005-310952

SUMMARY OF THE INVENTION

Problem to be Solved by the Invention

However, high filling of the soft magnetic particles in the magnetic film causes a phenomenon (spring back) in which repulsion of the soft magnetic particles with each other or repulsion by the resin elasticity occurs. As a result, gaps (voids) occur in the soft magnetic film. Then, at the time of high temperature treatment such as reflow treatment, gaps expand and may cause peeling or appearance defect of the soft magnetic film.

However, even with the electromagnetic interference suppressor described in Patent Document 2, many gaps occur at the inside thereof, suppression of the spring back is insufficient.

When the spring back is suppressed and the soft magnetic particles are contained at a high ratio, desired magnetic properties may not be obtained.

It is an object of the present invention to provide a soft magnetic resin composition having excellent magnetic properties and capable of suppressing the occurrence of gaps, and a soft magnetic film obtained from the soft magnetic resin composition.

Means for Solving the Problem

The present invention [1] includes a soft magnetic resin composition containing flat soft magnetic particles, and a resin component containing an epoxy resin, a phenol resin, and an acrylic resin, wherein the epoxy resin consists of only an epoxy resin having three or more functional groups, the phenol resin consists of only a phenol resin having three or more functional groups, and the content ratio of the acrylic resin in the resin component is 25 mass % or more.

The present invention [2] includes the soft magnetic resin composition described in [1], wherein the total content of the epoxy resin and the phenol resin with respect to 100 parts by mass of the soft magnetic particle-excluding component excluding the soft magnetic particles is 20 parts by mass or more and 60 parts by mass or less.

The present invention [3] includes the soft magnetic resin composition described in [1] or [2], wherein the epoxy equivalent of the epoxy resin is 230 g/eq. or less and the hydroxyl equivalent of the phenol resin is 230 g/eq. or less.

The present invention [4] includes the soft magnetic resin composition described in any one of [1] to [3], wherein the epoxy resin having three or more functional groups is a trishydroxyphenylmethane epoxy resin, and the phenol resin having three or more functional groups is a phenol novolak resin.

The present invention [5] includes the soft magnetic resin composition described in any one of [1] to [3], wherein the epoxy resin having three or more functional groups is a cresol novolak epoxy resin, and the phenol resin having three or more functional groups is a phenol biphenylene resin.

The present invention [6] includes the soft magnetic resin composition described in any one of [1] to [5], wherein the content ratio of the soft magnetic particles is 40% by volume or more.

The present invention [7] includes a soft magnetic film obtained by curing the soft magnetic resin composition by heating described in any one of [1] to [6].

Effect of the Invention

The soft magnetic film of the present invention obtained from the soft magnetic resin composition of the present invention has excellent magnetic properties. Also, occurrence of gaps at the inside of the soft magnetic film can be suppressed.

BRIEF DESCRIPTION OF THE DRAWINGS

FIG. 1 shows a cross-sectional view of a soft magnetic laminated circuit board including one embodiment of a soft magnetic film of the present invention.

DESCRIPTION OF EMBODIMENTS

A soft magnetic resin composition of the present invention contains flat soft magnetic particles and a resin component.

Examples of a soft magnetic material that constitutes the soft magnetic particles include magnetic stainless steel (Fe—Cr—Al—Si alloy), Sendust (Fe—Si—Al alloy), Permalloy (Fe—Ni alloy), silicon copper (Fe—Cu—Si alloy), Fe—Si alloy, Fe—Si—B (—Cu—Nb) alloy, Fe—Si—Cr—Ni alloy, Fe—Si—Cr alloy, Fe—Si—Al—Ni—Cr alloy, and ferrite. Among these, preferably, in view of magnetic properties, Sendust (Fe—Si—Al alloy) is used.

In the soft magnetic particles, for example, a material can be selected in accordance with frequency such as soft magnetic particles for low frequency and soft magnetic particles for high frequency. The soft magnetic particles for low frequency are, for example, soft magnetic particles having high concentration of magnetic flux and low magnetic flux loss (that is, real part $\mu'$ of complex magnetic permeability is high and imaginary part $\mu''$ of complex magnetic permeability is low) at a frequency of below 2 MHz (in particular, 1 MHz). Examples of the soft magnetic particles for low frequency include soft magnetic particles having coercive force of below 3 (Oe) in an easy direction of magnetization. Meanwhile, the soft magnetic particles for high frequency are, for example, soft magnetic particles having particularly low magnetic flux loss (that is, imaginary part $\mu''$ of complex magnetic permeability is low) at a frequency of 2 MHz or more (in particular, 10 MHz). Examples of the soft magnetic particles for high frequency include soft magnetic particles having coercive force of 3 (Oe) or more in the easy direction of magnetization.

The soft magnetic particles have a flat (platy) shape, that is, are formed to have a thin thickness and a wide plane. The soft magnetic particles have an aspect ratio of, for example, 8 or more, preferably 15 or more, and for example, 500 or less, preferably 450 or less. The aspect ratio is calculated, for example, as an aspect ratio by dividing the average particle size (average length) of the soft magnetic particles with the average thickness of the soft magnetic particles.

The soft magnetic particles have an average particle size (average length) of, for example, 3.5 μm or more, preferably 10 μm or more, and for example, 200 μm or less, preferably 150 μm or less. The average thickness is, for example, 0.1 μm or more, preferably 0.2 μm or more, and for example, 3.0 μm or less, preferably 2.5 μm or less. By adjusting the aspect ratio, the average particle size, and the average thickness of the soft magnetic particles, demagnetization effects of the soft magnetic particles can be reduced, and as a result, the magnetic permeability (real part $\mu'$ of complex magnetic permeability) of the soft magnetic particles can be increased. To equalize the size of the soft magnetic particles, as necessary, those soft magnetic particles classified with, for example, a sieve can be used.

The soft magnetic particles have a specific gravity of, for example, 5.0 or more and 8.5 or less.

The mass ratio of the soft magnetic particles in the soft magnetic resin composition is, in terms of a solid content, for example, 80 mass % or more, preferably 83 mass % or more, more preferably 85 mass % or more, and for example, 98 mass % or less, preferably 95 mass % or less, more preferably 90 mass % or less. Also, the volume ratio of the soft magnetic particles in the soft magnetic resin composition is, in terms of a solid content, for example, 40% by volume or more, preferably 45% by volume or more, more preferably 48% by volume or more, further more preferably 60% by volume or more, and for example, 90% by volume or less, preferably 85% by volume or less, more preferably 80% by volume or less. By setting the content ratio of the soft magnetic particles in the range of the above-described lower limit or more, the soft magnetic film having excellent magnetic properties can be achieved. Meanwhile, by setting the content ratio of the soft magnetic particles in the range of the above-described upper limit or less, the soft magnetic resin composition having excellent film-forming properties can be achieved.

The volume ratio of each of the components such as the soft magnetic particles is calculated based on the theoretical volume obtained by dividing the mass of each of the components by the specific gravity of the component. The specific gravity of each of the components is obtained by a catalogue value or a known measurement method (for example, specific gravity measurement method to be described later).

The resin component contains an epoxy resin, a phenol resin, and an acrylic resin.

The epoxy resin is a thermosetting resin and an epoxy resin (polyfunctional epoxy resin) having three or more functional groups in a molecule. As the functional group, preferably, a glycidyl group is used.

To be specific, examples of the polyfunctional epoxy resin include phenol novolak epoxy resin, cresol novolak epoxy resin, trishydroxyphenylmethane epoxy resin, and tetraphenylolethane epoxy resin. These can be used singly, or can be used in combination of two or more.

Preferably, a cresol novolak epoxy resin and a trishydroxyphenylmethane epoxy resin are used.

A specific example of the cresol novolak epoxy resin includes a compound represented by the following formula (1), and a specific example of the trishydroxyphenylmethane epoxy resin includes a compound represented by the following formula (2).

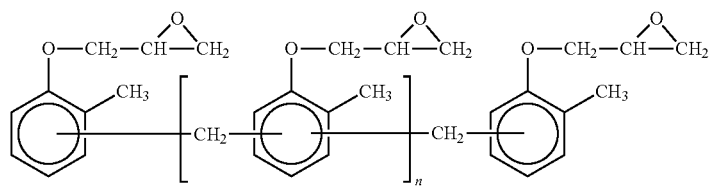

[Chemical Formula 1]

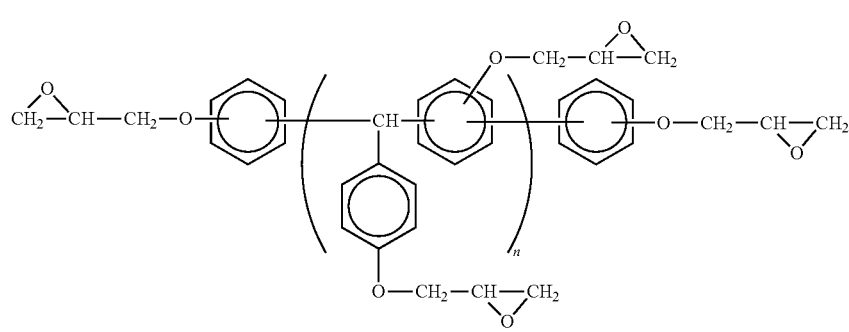

[Chemical Formula 2]

Each "n" represents a polymerization degree of a monomer independently.

The epoxy equivalent of the epoxy resin is, for example, 230 g/eq. or less, preferably 210 g/eq. or less, and for example, 10 g/eq. or more, preferably 50 g/eq. or more.

The viscosity (at 150° C.) of the epoxy resin is, for example, 1.0 Pa·s or less, preferably 0.2 Pa·s or less, and for example, 0.01 Pa·s or more. The viscosity is measured with an ICI viscometer.

The epoxy resin has a specific gravity of, for example, 1.0 or more and 1.5 or less.

In the present invention, the epoxy resin consists of only an epoxy resin having three or more functional groups. In other words, the epoxy resin in the resin component does not substantially contain an epoxy resin having two functional groups.

"Does not substantially contain an epoxy resin having two functional groups" means that the content ratio of the epoxy resin having two functional groups with respect to the total epoxy resin is, for example, 1.0 mass % or less, preferably 0.5 mass % or less, more preferably 0 mass %.

The phenol resin is a thermosetting resin that is a curing agent for the epoxy resin, and a phenol resin (polyfunctional phenol resin) having three or more functional groups in a molecule. As the functional group, preferably a hydroxyl group is used.

Examples of the polyfunctional resin include phenol novolak resin, cresol novolak resin, phenol aralkyl resin, phenol biphenylene resin, dicyclopentadiene phenol resin, and resol resin. These can be used singly, or can be used in combination of two or more.

Preferably, a phenol novolak resin and a phenol biphenylene resin are used.

A specific example of the phenol novolak resin includes a compound represented by the following formula (3), and a specific example of the phenol biphenylene resin includes a compound represented by the following formula (4).

[Chemical Formula 3]

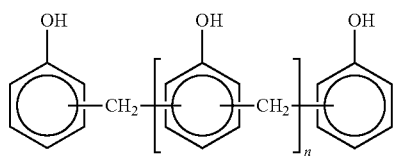

(3)

[Chemical Formula 4]

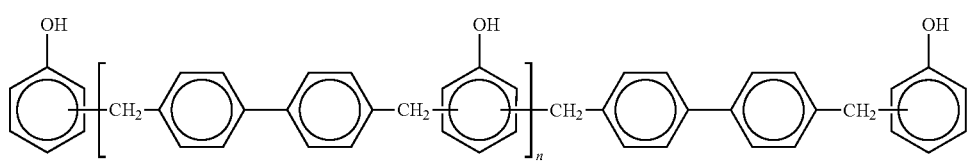

(4)

Each "n" represents a polymerization degree of a monomer independently.

The hydroxyl equivalent of the phenol resin is, for example, 230 g/eq. or less, preferably 210 g/eq. or less, and for example, 10 g/eq. or more, preferably 50 g/eq. or more.

The viscosity (at 150° C.) of the phenol resin is, for example, 0.10 Pa·s or less, preferably 0.04 Pa·s or less, and for example, 0.01 Pa·s or more.

The phenol resin has a specific gravity of, for example, 1.0 or more and 1.5 or less.

In the present invention, the phenol resin consists of only a phenol resin having three or more functional groups. In other words, the phenol resin in the resin component does not substantially contain a phenol resin having two functional groups.

"Does not substantially contain a phenol resin having two functional groups" means that the content ratio of the phenol resin having two functional groups with respect to the total phenol resin is, for example, 1.0 mass % or less, preferably 0.5 mass % or less, more preferably 0 mass %.

In the present invention, as a combination of the epoxy resin and the phenol resin, in view of suppressing gaps and magnetic properties, preferably, a combination of (1) the trishydroxyphenylmethane epoxy resin and the phenol novolak resin, and a combination of (2) the cresol novolak epoxy resin and the phenol biphenylene resin are used. More preferably, a combination of (1) is used.

The soft magnetic resin composition of the present invention contains a polyfunctional epoxy resin and a polyfunctional phenol resin as a curing resin. Thus, the polyfunctional epoxy resin and the polyfunctional phenol resin can be cross-linked to each other with high density, thereby forming a curing resin with high intensity. Thus, when the soft magnetic resin composition containing the soft magnetic particles at a high ratio is compressed, and the soft magnetic film with a high filling rate is produced, occurrence of cracks of the curing resin caused by a repulsive force of the soft magnetic particles with each other or resin elasticity, and furthermore, occurrence of gaps (spring back) can be suppressed.

The soft magnetic resin composition of the present invention consists of only the polyfunctional epoxy resin and the polyfunctional phenol resin as the curing resin. That is, the soft magnetic resin composition of the present invention does not contain a bifunctional epoxy resin or a bifunctional phenol resin. Thus, a resin region that is cross-linked at low density (that is, fragile resin region) is not contained. Thus, in the present invention, a uniform and strong curing resin can be formed. Therefore, when the soft magnetic resin composition of the present invention is used, occurrence of small gaps having a size of micro order (1 to 1000 μm) can be also suppressed.

An example of the acrylic resin includes an acrylic polymer produced by polymerizing a monomer component of one, or two or more alkyl (meth)acrylates having a straight chain or branched alkyl group. The "(meth)acryl" represents "acryl and/or methacryl".

An example of the alkyl group includes an alkyl group having 1 to 20 carbon atoms such as methyl group, ethyl group, propyl group, isopropyl group, n-butyl group, t-butyl group, isobutyl group, amyl group, isoamyl group, hexyl group, heptyl group, cyclohexyl group, 2-ethylhexyl group, octyl group, isooctyl group, nonyl group, isononyl group, decyl group, isodecyl group, undecyl group, lauryl group, tridecyl group, tetradecyl group, stearyl group, octadecyl group, and dodecyl group. Preferably, an alkyl group having 1 to 6 carbon atoms is used.

The acrylic polymer can be a copolymer of alkyl (meth) acrylate and an additional monomer.

Examples of the additional monomer include glycidyl group-containing monomers such as glycidyl acrylate and glycidyl methacrylate; carboxyl group-containing monomers such as acrylic acid, methacrylic acid, carboxyethyl acrylate, carboxypentyl acrylate, itaconic acid, maleic acid, fumaric acid, and crotonic acid; acid anhydride monomers such as maleic anhydride and itaconic acid anhydride; hydroxyl group-containing monomers such as 2-hydroxyethyl (meth)acrylate, 2-hydroxypropyl (meth)acrylate, 4-hydroxybutyl (meth)acrylate, 6-hydroxyhexyl (meth)acrylate, 8-hydroxyoctyl (meth)acrylate, 10-hydroxydecyl (meth) acrylate, 12-hydroxylauryl (meth)acrylate, and (4-hydroxymethylcyclohexyl)-methyl acrylate; sulfonic acid group-containing monomers such as styrenesulfonic acid, allylsulfonic acid, 2-(meth) acrylamide-2-methylpropanesulfonic acid, (meth)acrylamidepropanesulfonic acid, sulfopropyl (meth)acrylate, and (meth)acryloyloxynaphthalenesulfonic acid; phosphoric acid group-containing monomers such as 2-hydroxyethylacryloyl phosphate; styrene monomer; and acrylonitrile. These can be used singly, or can be used in combination of two or more. Among these, preferably, acrylonitrile is used.

The acrylic resin preferably includes at least one group of the carboxy group and the hydroxyl group. More preferably, the carboxy group and the hydroxyl group are used in combination. In this manner, occurrence of gaps can be more surely suppressed, and the magnetic properties can be improved.

The acrylic resin has a weight-average molecular weight of, for example, $1\times10^5$ or more, preferably $3\times10^5$ or more, and for example, $1\times10^6$ or less. The weight-average molecular weight is measured based on polystyrene standard calibration value by Gel Permeation Chromatography (GPC).

The acrylic resin has a specific gravity of, for example, 0.6 or more and 1.2 or less.

The resin component can contain an additional resin in addition to the epoxy resin, the phenol resin, and the acrylic resin. However, preferably, the resin component consists of only the epoxy resin, the phenol resin, and the acrylic resin.

The mass ratio of the resin component in the soft magnetic resin composition is, in terms of a solid content, for example, 2 mass % or more, preferably 5 mass % or more, more preferably 10 mass % or more, and for example, 20 mass % or less, preferably 17 mass % or less, more preferably 15 mass % or less. Also, the volume ratio of the resin component in the soft magnetic resin composition is, in terms of a solid content, for example, 10% by volume or more, preferably 15% by volume or more, more preferably 20% by volume or more, and for example, 60% by volume or less, preferably 55% by volume or less, more preferably 52% by volume or less, further more preferably 40% by volume or less. By setting the content ratio of the resin component in the above-described range, the soft magnetic film having excellent film-forming properties and excellent magnetic properties can be achieved.

The total content of the epoxy resin and the phenol resin (that is, curing resin) with respect to 100 parts by mass of the soft magnetic particle-excluding component excluding the soft magnetic particles from the soft magnetic thermosetting composition is, for example, 20 parts by mass or more, preferably 30 parts by mass or more, more preferably 40 parts by mass or more, and for example, 60 parts by mass or less.

By setting the total content of the epoxy resin and the phenol resin in the above-described range, the soft magnetic particles can be contained in the soft magnetic film at a high ratio, and the spring back can be suppressed.

To be more specific, the soft magnetic particle-excluding component is a component (solid content) made of a resin component, a thermosetting catalyst, and an additive (described later) that is, as necessary, added, and does not include the soft magnetic particles and a solvent.

The mass ratio of the epoxy resin in the resin component is, for example, 5 mass % or more, preferably 10 mass % or more, more preferably 25 mass % or more, and for example, 50 mass % or less, preferably 40 mass % or less, more preferably 35 mass % or less. The volume ratio of the epoxy resin in the resin component is, for example, 5% by volume or more, preferably 10% by volume or more, more preferably 25% by volume or more, and for example, 50% by volume or less, preferably 40% by volume or less, more preferably 35% by volume or less.

The mass ratio of the phenol resin in the resin component is, for example, 5 mass % or more, preferably 10 mass % or more, more preferably 25 mass % or more, and for example, 50 mass % or less, preferably 40 mass % or less, more preferably 35 mass % or less. The volume ratio of the phenol resin in the resin component is, for example, 5% by volume or more, preferably 10% by volume or more, more preferably 25% by volume or more, and for example, 50% by volume or less, preferably 40% by volume or less, more preferably 35% by volume or less.

The mass ratio of the acrylic resin in the resin component is, for example, 25 mass % or more, preferably 30 mass % or more, more preferably 35 mass % or more, and for example, 80 mass % or less, preferably 70 mass % or less, more preferably 60 mass % or less. The volume ratio of the acrylic resin in the resin component is, for example, 25% by volume or more, preferably 30% by volume or more, more preferably 35% by volume or more, and for example, 80% by volume or less, preferably 70% by volume or less, more preferably 60% by volume or less. When the content ratio of the acrylic resin is within the above-described range, the spring back of the soft magnetic film can be suppressed. Also, the viscosity of the soft magnetic resin composition can be made excellent, and the film-forming properties can be improved. Furthermore, the orientation of the soft magnetic particles at the inside of the resin after film-forming can be improved. As a result, the magnetic properties can be improved.

The soft magnetic resin composition preferably contains a thermosetting catalyst.

The thermosetting catalyst is not limited as long as the catalyst accelerates curing of the resin component by heating, and for example, an imidazole compound, a triphenylphosphine compound, a triphenylborane compound, and an amino group-containing compound can be used. Preferably, an imidazole compound is used.

Examples of the imidazole compound include 2-phenylimidazole (trade name; 2PZ), 2-ethyl-4-methylimidazole (trade name; 2E4MZ), 2-methylimidazole (trade name; 2MZ), 2-undecylimidazole (trade name; C11Z), 2-phenyl-1H-imidazole 4,5-dimethanol (trade name; 2PHZ-PW), and 2,4-diamino-6-(2'-methylimidazolyl (1)') ethyl-s-triazine-isocyanuric acid adduct (trade name; 2MAOK-PW) (the products with the trade names shown above are all manufactured by Shikoku Chemicals Corporation.).

These can be used singly, or can be used in combination of two or more.

The thermosetting catalyst has a specific gravity of, for example, 0.9 or more and 1.5 or less.

The mass ratio of the thermosetting catalyst with respect to 100 parts by mass of the resin component is, for example, 0.1 parts by mass or more, preferably 0.3 parts by mass or more, and for example, 5 parts by mass or less, preferably 3 parts by mass or less. By setting the content ratio of the thermosetting catalyst in the above-described range, the soft magnetic resin composition can be cured by heating at a low temperature for a short time, and gaps of the soft magnetic film can be suppressed.

The soft magnetic resin composition preferably contains a dispersant. The soft magnetic resin composition contains a dispersant, so that the soft magnetic particles can be more uniformly dispersed in the soft magnetic film.

As the dispersant, in terms of dispersing properties and magnetic properties, preferably, polyether phosphate ester is used.

To be specific, an example of the polyether phosphate ester includes the HIPLAAD series ("ED-152", "ED-153", "ED-154", "ED-118", "ED-174", and "ED-251") manufactured by Kusumoto Chemicals, Ltd.

The polyether phosphate ester has an acid value of, for example, 10 or more, preferably 15 or more, and for example, 200 or less, preferably 150 or less. The acid value is measured by a neutralization titration method or the like.

The dispersant has a specific gravity of, for example, 0.8 or more and 1.2 or less.

The mass ratio of the dispersant with respect to 100 parts by mass of the resin component is, for example, 0.1 parts by mass or more, preferably 0.3 parts by mass or more, and for example, 5 parts by mass or less, preferably 3 parts by mass or less.

The soft magnetic resin composition can also contain a rheology control agent. The soft magnetic resin composition contains the rheology control agent, so that the soft magnetic particles can be more uniformly dispersed in the soft magnetic film.

The rheology control agent is a compound that imparts thixotropic properties of showing high viscosity in the case of a low shearing force (shearing rate) and showing low viscosity in the case of a high shearing force (shearing rate) to the soft magnetic resin composition.

Examples of the rheology control agent include an organic rheology control agent and an inorganic rheology control agent. Preferably, an organic rheology control agent is used.

Examples of the organic rheology control agent include modified urea, urea-modified polyamide, aliphatic acid amide, polyurethane, and polymeric urea derivative. Preferably, modified urea, a urea-modified polyamide, and an aliphatic acid amide are used, more preferably, a urea-modified polyamide is used.

Examples of the inorganic rheology control agent include silica, calcium carbonate, and smectite.

To be specific, examples of the rheology control agent include "BYK-410", "BYK-430", and "BYK-431" manufactured by BYK Japan KK, "DISPARLON PFA-131" manufactured by Kusumoto Chemicals, Ltd., and "AEROSIL VP NK200", "AEROSIL R976S", and "AEROSIL COK84" manufactured by NIPPON AEROSIL CO., LTD.

These can be used singly, or can be used in combination of two or more.

The rheology control agent has a specific gravity of, for example, 0.6 or more and 1.0 or less.

The mass ratio of the rheology control agent with respect to 100 parts by mass of the resin component is, for example, 0.1 parts by mass or more, preferably 0.5 parts by mass or more, and for example, 10 parts by mass or less, preferably 5 parts by mass or less.

The soft magnetic resin composition can further also contain an additional additive as necessary. Examples of the additive include a commercially available or known crosslinking agent and inorganic filler.

The soft magnetic resin composition can be prepared by mixing the above-described components at the above-described mixing ratio.

The soft magnetic film is formed from the soft magnetic resin composition into a film shape (sheet shape). Preferably, the soft magnetic film can be obtained by curing the soft magnetic resin composition into a film shape by heating.

To be specific, the soft magnetic film can be, for example, produced from a preparation step in which a solution of a soft magnetic resin composition is prepared by dissolving or dispersing a soft magnetic resin composition in a solvent, a drying step in which the solution of the soft magnetic resin composition is applied on the surface of a release substrate and dried to produce a soft magnetic thermosetting film in semi-cured state, and a heat pressing step in which a plurality of soft magnetic thermosetting films are laminated and heat pressed.

First, the soft magnetic resin composition is dissolved or dispersed in the solvent (preparation step). The solution of the soft magnetic resin composition is prepared in this manner.

Examples of the solvent include organic solvents including ketones such as acetone and methyl ethyl ketone (MEK); esters such as ethyl acetate; ethers such as propylene glycol monomethyl ether; and amides such as N,N-dimethylformamide Examples of the solvent also include water, and water-based solvents such as alcohols including methanol, ethanol, propanol, and isopropanol.

The solution of the soft magnetic resin composition has a solid content amount of, for example, 10 mass % or more, preferably 30 mass % or more, and for example, 90 mass % or less, preferably 70 mass % or less.

Then, the solution of the soft magnetic resin composition is applied on the surface of the release substrate (separator, core material, etc.) and dried (drying step).

The application method is not particularly limited, and examples thereof include a doctor blade method, roll application, screen application, and gravure application.

The drying conditions are as follows: a drying temperature of, for example, 70° C. or more and 160° C. or less, and a drying time of, for example, 1 minute or more and 5 minutes or less.

Examples of the separator include a polyethylene terephthalate (PET) film, a polyethylene film, a polypropylene film, and paper. Surfaces of these are release-treated with, for example, a fluorine release agent, a long-chain alkylacrylate release agent, and a silicone release agent.

Examples of the core material include a plastic film (for example, polyimide film, polyester film, polyethylene terephthalate film, polyethylenenaphthalate film, polycarbonate film, etc.), a metal film (for example, aluminum foil etc.), a resin substrate reinforced with glass fiber or plastic-made nonwoven fiber, a silicon substrate, and a glass substrate.

The separator or the core material has an average thickness of, for example, 1 µm or more and 500 µm or less.

A soft magnetic thermosetting film in semi-cured state (B-stage state) is produced in this manner.

The soft magnetic thermosetting film has an average thickness of, for example, 5 µm or more, preferably 10 µm or more, and for example, 500 µm or less, preferably 250 µm or less.

Then, a plurality of produced soft magnetic thermosetting films are prepared, and the plurality of soft magnetic thermosetting films are heat pressed with a heat press in a thickness direction (heat pressing step). The soft magnetic thermosetting films in semi-cured state are cured by heating in this manner. Also, the soft magnetic film is filled with the soft magnetic particles at a high ratio, and the magnetic properties can be improved.

The heat pressing can be performed by using a known press, and for example, a parallel plate press is used.

For example, two layers or more, and 20 layers or less, preferably 5 layers or less of the soft magnetic thermosetting films are laminated. The soft magnetic film can be adjusted to have a desired thickness in this manner.

The heating temperature is, for example, 80° C. or more, preferably 100° C. or more, and for example, 250° C. or less, preferably 200° C. or less.

The heating time is, for example, 1 minute or more, preferably 2 minutes or more, and for example, 24 hours or less, preferably 2 hours or less.

The pressure is, for example, 0.01 MPa or more, preferably 0.1 MPa or more, and for example, 200 MPa or less, preferably 100 MPa or less.

In this manner, the soft magnetic thermosetting film is cured by heating, thereby producing a soft magnetic film in cured state (C-stage state).

The soft magnetic film has an average thickness of, for example, 5 µm or more, preferably 10 µm or more, and for example, 500 µm or less, preferably 250 µm or less.

The soft magnetic film has an actual specific gravity of, for example, 3.00 or more, preferably 3.50 or more, and for example, 6.00 or less.

The actual specific gravity to the theoretical specific gravity (actual specific gravity/theoretical specific gravity) of the soft magnetic film is, for example, 0.93 or more, preferably 0.95 or more, and for example, 1.00 or less.

The actual specific gravity (S.G.) is, for example, measured by a specific gravity measurement method. That is, the weight W1 (g) of the soft magnetic film in the air and the weight W2 (g) of the soft magnetic film in water are measured, and calculated by the following formula.

$$\text{Actual specific gravity (S.G.)} = W1/(W1-W2)$$

To be specific, the actual specific gravity can be measured using an electronic densimeter (manufactured by Alfa Mirage Co., Ltd., "MDS-300").

The theoretical specific gravity can be, for example, obtained by multiplying the specific gravity of each of the solid components by the mixing ratio (weight) of each of the solid components and adding up these as to each of the solid components (the soft magnetic particles and the resin component; and the thermosetting catalyst, the dispersant, the rheology control agent, the additional additive etc. that are added as necessary) contained in the soft magnetic resin composition that forms the soft magnetic film. The specific gravity of each of the solid components (for example, the soft magnetic particles) can be referred to the catalogue value or the like.

Of each of the solid components of the soft magnetic resin composition, when the soft magnetic particles and the resin component make up the main component, the theoretical specific gravity of the soft magnetic film consisting of only the soft magnetic particles and the resin component can be also replaced with the theoretical specific gravity of the soft magnetic film.

As to the relative magnetic permeability of the soft magnetic film, the real part μ' of complex magnetic permeability at 1 MHz is, for example, 60 or more, preferably 70 or more, more preferably 80 or more, and for example, 500 or less. In particular, when the soft magnetic particles for low frequency are used for the low frequency applications of below 2 MHz, the real part μ' of complex magnetic permeability at 1 MHz is further more preferably 150 or more, particularly preferably 170 or more.

The imaginary part μ" of complex magnetic permeability at 1 MHz is, for example, 20 or less, preferably 10 or less.

The real part μ' of complex magnetic permeability at 10 MHz is, for example, 60 or more, preferably 70 or more, more preferably 80 or more, and for example, 500 or less.

The imaginary part μ" of complex magnetic permeability at 10 MHz is, for example, 100 or less, preferably 50 or less. In particular, when the soft magnetic particles for high frequency are used for the high frequency applications of 2 MHz or more, the imaginary part μ" of complex magnetic permeability at 10 MHz is more preferably 20 or less, further more preferably 10 or less, particularly preferably 5 or less.

The relative magnetic permeability (the real part μ' of complex magnetic permeability and the imaginary part μ" of complex magnetic permeability) of the soft magnetic film is measured using an impedance analyzer (manufactured by Agilent Technologies, "4294A") by one turn method.

In the soft magnetic film, the flat soft magnetic particles contained in the soft magnetic film are preferably arranged in a 2-dementional in-plane direction of the soft magnetic film. That is, a longitudinal direction (direction perpendicular to thickness direction) of the flat soft magnetic particles is oriented to be along a surface direction of the soft magnetic film. In this manner, the soft magnetic film is filled with the soft magnetic particles at a high ratio, and has excellent magnetic properties. Also, a thin soft magnetic film is achieved.

The soft magnetic film can be, for example, a single layer structure consisting of only a single layer of the soft magnetic film, a multiple layer structure in which the soft magnetic film is laminated on one side or both sides of the core material, or a multiple layer structure in which a separator is laminated on one side or both sides of the soft magnetic film.

Although the plurality of soft magnetic thermosetting films are laminated and heat pressed in the above-described embodiment, for example, the heat pressing can be performed on a single soft magnetic thermosetting film (single layer).

According to the soft magnetic film obtained using the soft magnetic resin composition of the present invention, while the soft magnetic particles are contained at a high content ratio, occurrence of gaps at the inside of the soft magnetic film is suppressed. Thus, after the reflow step, peeling or appearance defect of the soft magnetic film caused by expansion of the gaps can be suppressed. Also, the soft magnetic film has excellent film-forming properties, and orientation of the soft magnetic particles can be improved. Accordingly, the soft magnetic film can develop excellent relative magnetic permeability (real part μ' of complex magnetic permeability).

The soft magnetic film can be preferably used as a soft magnetic film to be laminated on, for example, an antenna, a coil, or a circuit board having these formed on the surface thereof.

To be specific, for example, as shown in FIG. 1, the soft magnetic film can be used as a soft magnetic film laminated board 1 including a circuit board 2, an adhesive layer 3 disposed on the lower surface (one surface) of the circuit board 2, and a soft magnetic film 4 disposed on the lower surface of the adhesive layer 3.

The circuit board 2 is, for example, the circuit board 2 in which an electromagnetic induction system is used, and has a wiring pattern 6 of, for example, a loop coil formed on the upper surface (one surface) of a substrate 5. The wiring pattern 6 is formed by, for example, a semi-additive method or a subtractive method.

Examples of an insulating material that forms the substrate 5 include a glass epoxy substrate, a glass substrate, a PET substrate, a Teflon substrate, a ceramics substrate, and a polyimide substrate.

As the adhesive layer 3, a known and generally used adhesive of the circuit board 2 is used, and the adhesive layer 3 is, for example, formed by applying and drying an adhesive such as an epoxy adhesive, a polyimide adhesive, and an acrylic adhesive. The adhesive layer 3 has a thickness of, for example, 10 to 100 μm.

The soft magnetic film 4 is the above-described soft magnetic film, and flat soft magnetic particles 7 are dispersed in a soft magnetic resin composition (to be specific, curing resin 8 obtained by curing the resin component). Preferably, the soft magnetic particles 7 are oriented so that the longitudinal direction (direction perpendicular to the thickness direction) thereof is along the surface direction of the soft magnetic film 4.

The soft magnetic film laminated board 1 can be used for low frequency applications such as smartphones, personal computers, and position detection devices. Also, the soft magnetic film laminated board 1 can be used for high frequency applications such as coil modules for wireless communications or wireless power transmission using a high frequency zone of 13.56 MHz or 6.78 MHz.

Although the adhesive layer 3 is provided between the circuit board 2 and the soft magnetic film 4 in the embodiment of FIG. 1, for example, though not shown, the soft magnetic film 4 can be also provided on the circuit board 2 so as to be in direct contact thereto.

To directly laminate the soft magnetic film 4 on the circuit board 2, after the soft magnetic thermosetting film in semi-cured state is directly attached to the circuit board 2, the soft magnetic thermosetting film is cured by heating.

According to the soft magnetic film laminated board 1, the soft magnetic film 4 is included, so that gaps at the inside of the soft magnetic film 4 after reflow can be suppressed, and peeling or appearance defect of the soft magnetic film 4 can be also suppressed. Also, a reduction of the magnetic properties can be suppressed.

EXAMPLES

In the following, the present invention will be described in detail with Examples and Comparative Examples, but the present invention is not limited thereto. The specific numerical values in mixing ratio (content ratio), property value, and parameter used in the following description will be replaced with upper limits (numerical values defined as "or less" or "below") or lower limits (numerical values defined as "or more" or "above") of corresponding numerical values in mixing ratio (content ratio), property value, and parameter described in the above-described "DESCRIPTION OF EMBODIMENTS".

Example 1

A soft magnetic resin composition of Example 1 was produced by mixing, in terms of a solid content, 88.5 parts by mass of Fe—Si—Al alloy, 3.0 parts by mass of cresol novolak epoxy resin, 3.0 parts by mass of phenol biphenylene resin, 5.1 parts by mass of acrylic resin, 0.1 parts by mass of thermosetting catalyst, 0.1 parts by mass of dispersant, and 0.2 parts by mass of rheology control agent so that the volume ratio of the soft magnetic particles with respect to the soft magnetic resin composition was 55.0% by volume.

The soft magnetic resin composition was dissolved in methyl ethyl ketone, thereby preparing a solution of the soft magnetic resin composition having a solid content concentration of 45 mass %.

The solution of the soft magnetic resin composition was applied onto a separator (polyethylene terephthalate film subjected to silicone release treatment), and thereafter, dried at 110° C. for 2 minutes. In this manner, the soft magnetic thermosetting film in semi-cured state (average thickness of 45 μm) was produced.

Next, five layers of soft magnetic thermosetting films were laminated, and then, cured by heating by heat pressing under the conditions of 175° C., 30 minutes, and 10 MPa, so that a soft magnetic film (average thickness of 150 μm) in completely cured state of Example 1 was produced.

Examples 2 to 3

Soft magnetic resin compositions of Examples 2 to 3 were obtained with the materials and the mixing ratios described in Table 1. Soft magnetic films (average thickness of 150 μm) of Examples 2 to 3 were produced in the same manner as that of Example 1, except that each of the soft magnetic resin compositions of Examples was used.

Examples 4 to 6

Soft magnetic resin compositions of Examples 4 to 6 were obtained with the materials and the mixing ratios described in Tables 1 and 2. Soft magnetic films (average thickness of 150 μm) of Examples 4 to 6 were produced in the same manner as that of Example 1, except that each of the soft magnetic resin compositions of Examples was used, and the heat pressing conditions were changed to 175° C., 30 minutes, and 20 MPa.

Comparative Examples 1 to 2

Soft magnetic resin compositions of Comparative Examples 1 to 2 were obtained with the materials and the mixing ratios described in Table 1. Soft magnetic films (average thickness of 150 μm) of Comparative Examples 1 to 2 were produced in the same manner as that of Example 1, except that each of the soft magnetic resin compositions was used.

Comparative Examples 3 to 6

Soft magnetic resin compositions of Comparative Examples 3 to 6 were obtained with the materials and the mixing ratios described in Tables 1 and 2. Soft magnetic films (average thickness of 150 μm) of Comparative Examples 3 to 6 were produced in the same manner as that of Example 1, except that each of the soft magnetic resin compositions of Comparative Examples was used, and the heat pressing conditions were changed to 175° C., 30 minutes, and 20 MPa.

(Actual Specific Gravity)

The actual specific gravity (S. G.) of each of the soft magnetic films of Examples and Comparative Examples was measured using an electronic densimeter (manufactured by Alfa Mirage Co., Ltd., "MDS-300").

The theoretical specific gravity of each of the soft magnetic films was calculated, and the actual specific gravity/theoretical specific gravity were obtained.

The results are shown in Tables 1 and 2.

(Confirmation of Gap)

A cross-sectional side surface of each of the soft magnetic films of Examples and Comparative Examples was observed with SEM (magnification: 5000 times) to check if a gap occurred or not.

A case where occurrence of a gap was not confirmed was evaluated as "Excellent". A case where a gap of 0.1 μm or more and below 1.0 μm was slightly confirmed, but occurrence of a gap of 1.0 μm or more was not confirmed was evaluated as "Good". A case where occurrence of a gap of 1.0 μm or more and below 10 μm was confirmed was evaluated as "Poor". A case where occurrence of a gap of 10 μm or more was confirmed was evaluated as "Bad". The results are shown in Tables 1 and 2.

(Relative Magnetic Permeability)

The relative magnetic permeability (the real part μ' of complex magnetic permeability and the imaginary part μ" of complex magnetic permeability) of each of the soft magnetic films of Examples and Comparative Examples was measured using an impedance analyzer (manufactured by Agilent Technologies, "4291B") by one turn method (frequency of 1 MHz, 10 MHz). The results are shown in Tables 1 and 2.

(Film-Forming Properties)

Each of the solutions of the soft magnetic resin composition in Examples and Comparative Examples was applied onto a separator and then, dried at 130° C. for two minutes. Thereafter, the appearance of the surface of the resulting soft magnetic thermosetting film was observed.

A case where the film surface was extremely smooth, and a pinhole was not observed was evaluated as "Excellent". A case where the film surface was smooth, and a pinhole was not observed was evaluated as "Good". A case where the film surface was uneven, but a pinhole was not observed was evaluated as "Poor". A case where the film surface was uneven, and a large number of pinholes were observed was evaluated as "Bad". The results are shown in Tables 1 and 2.

(Consideration)

As clear from Tables 1 and 2, each of the soft magnetic resin compositions of Examples, and the soft magnetic film obtained from each of the soft magnetic resin compositions have excellent magnetic properties and can sufficiently suppress occurrence of gaps, and also have excellent film-forming properties. It is clear that the real part μ' of complex magnetic permeability, in particular, has high numerical values and shows more excellent concentration of magnetic flux both in the low frequency (1 MHz) and the high frequency (10 MHz) compared to Comparative Examples. It is clear that the imaginary part μ" of complex magnetic permeability shows almost the same numerical value as that of Comparative Examples both in the low frequency (1 MHz) and the high frequency (10 MHz), and the magnetic flux loss is not reduced. That is, the magnetic flux loss is prevented, and the concentration of magnetic flux is made excellent, so that each of the soft magnetic resin compositions of Examples, and the soft magnetic film obtained from each of the soft magnetic resin compositions have excellent properties as a magnetic film to be used in antennas provided in the electronic devices.

TABLE 1

| | | | | Ex. 1 | Ex. 2 | Ex. 3 | Ex. 4 | Ex. 5 |
|---|---|---|---|---|---|---|---|---|
| Resin Composition | Soft Magnetic Particles | Fe—Si—Al Alloy for Low Frequency | wt % | 88.5 | 88.4 | 88.2 | 92.0 | 92.0 |
| | | | vol % | 55.0 | 55.0 | 55.0 | 65.0 | 65.0 |
| | Resin Component | Epoxy Resin | Cresol Novolak-Type | 3.0 | — | 4.1 | 2.0 | — |
| | | | Trishydroxyphenylmethane-Type | — | 3.8 | — | — | 1.6 |
| | | | Bisphenol A-Type | — | — | — | — | — |
| | | Phenol Resin | Phenol Biphenylene | 3.0 | — | 4.3 | 2.1 | — |
| | | | Phenol Novolak | — | 2.3 | — | — | 2.5 |
| | | Acrylic Resin | SG-70L | 5.1 | 5.1 | 3.0 | 3.5 | 3.5 |
| | | | Acrylic Resin Content (wt %) in Resin Component | 45.9 | 45.5 | 26.3 | 46.0 | 45.5 |
| | Thermosetting Catalyst | Imidazole Compound | | 0.1 | 0.1 | 0.1 | 0.1 | 0.1 |
| | Dispersant | Polyether Phosphate Ester | | 0.1 | 0.1 | 0.1 | 0.1 | 0.1 |
| | Rheology Control Agent | Urea-Modified Intermediate Polarity Polyamide | | 0.2 | 0.2 | 0.2 | 0.2 | 0.2 |
| Evaluation | Actual Specific Gravity | | | 4.23 | 4.23 | 4.18 | 4.51 | 4.59 |
| | Actual Specific Gravity/Theoretical Specific Gravity | | | 1.00 | 1.00 | 0.99 | 0.94 | 0.96 |
| | Relative Magnetic Permeability | 1 MHz | Real Part $\mu'$ of Complex Magnetic Permeability | 181 | 182 | 175 | 187 | 191 |
| | | | Imaginary Part $\mu''$ of Complex Magnetic Permeability | 3 | 3 | 2 | 3 | 3 |
| | | 10 MHz | Real Part $\mu'$ of Complex Magnetic Permeability | 170 | 171 | 165 | 179 | 183 |
| | | | Imaginary Part $\mu''$ of Complex Magnetic Permeability | 50 | 51 | 48 | 48 | 50 |
| | Presence or Absence of Gap | | | Excellent | Excellent | Excellent | Good | Good |
| | Film-Forming Properties | | | Excellent | Excellent | Good | Good | Good |

| | | | | Comp. Ex. 1 | Comp. Ex. 2 | Comp. Ex. 3 | Comp. Ex. 4 |
|---|---|---|---|---|---|---|---|
| Resin Composition | Soft Magnetic Particles | Fe—Si—Al Alloy for Low Frequency | wt % | 88.5 | 87.9 | 92.1 | 91.7 |
| | | | vol % | 55.0 | 55.0 | 65.0 | 65.0 |
| | Resin Component | Epoxy Resin | Cresol Novolak-Type | 0.8 | 5.2 | 0.5 | 0.9 |
| | | | Trishydroxyphenylmethane-Type | — | — | — | — |
| | | | Bisphenol A-Type | 2.1 | — | 1.4 | 2.5 |
| | | Phenol Resin | Phenol Biphenylene | 3.1 | 5.5 | 2.1 | 3.8 |
| | | | Phenol Novolak | — | — | — | — |
| | | Acrylic Resin | SG-70L | 5.1 | 1.0 | 3.5 | 0.7 |
| | | | Acrylic Resin Content (wt %) in Resin Component | 46.0 | 8.5 | 46.0 | 8.7 |
| | Thermosetting Catalyst | Imidazole Compound | | 0.1 | 0.1 | 0.1 | 0.1 |
| | Dispersant | Polyether Phosphate Ester | | 0.1 | 0.1 | 0.1 | 0.1 |
| | Rheology Control Agent | Urea-Modified Intermediate Polarity Polyamide | | 0.2 | 0.2 | 0.2 | 0.2 |
| Evaluation | Actual Specific Gravity | | | 4.23 | 4.21 | 4.22 | 4.54 |
| | Actual Specific Gravity/Theoretical Specific Gravity | | | 1.00 | 1.00 | 0.88 | 0.95 |
| | Relative Magnetic Permeability | 1 MHz | Real Part $\mu'$ of Complex Magnetic Permeability | 182 | 159 | 173 | 166 |
| | | | Imaginary Part $\mu''$ of Complex Magnetic Permeability | 3 | 1 | 2 | 3 |
| | | 10 MHz | Real Part $\mu'$ of Complex Magnetic Permeability | 170 | 151 | 162 | 158 |
| | | | Imaginary Part $\mu''$ of Complex Magnetic Permeability | 50 | 42 | 47 | 46 |
| | Presence or Absence of Gap | | | Poor | Poor | Bad | Bad |
| | Film-Forming Properties | | | Good | Poor | Good | Bad |

TABLE 2

|  |  |  |  | Ex. 6 | Comp. Ex. 5 | Com. Ex. 6 |
|---|---|---|---|---|---|---|
| Resin Composition | Soft Magnetic Particles | Fe—Si—Al Alloy for Low Frequency | wt % | 90.3 | 90.3 | 89.8 |
|  |  |  | vol % | 60.0 | 60.0 | 60.0 |
|  | Resin Component | Epoxy Resin | Cresol Novolak-Type | 2.5 | 0.7 | 4.5 |
|  |  |  | Trishydroxyphenylmethane-Type | — | — | — |
|  |  |  | Bisphenol A-Type | — | 1.8 | — |
|  |  | Phenol Resin | Phenol Biphenylene | 2.6 | 2.6 | 4.6 |
|  |  |  | Phenol Novolak | — | — | — |
|  |  | Acrylic Resin | SG-70L | 4.2 | 4.2 | 0.8 |
|  |  |  | Acrylic Resin Content (wt %) in Resin Component | 45.2 | 45.2 | 8.0 |
|  | Thermosetting Catalyst | Imidazole Compound |  | 0.1 | 0.1 | 0.1 |
|  | Dispersant | Polyether Phosphate Ester |  | 0.1 | 0.1 | 0.1 |
|  | Rheology Control Agent | Urea-Modified Intermediate Polarity Polyamide |  | 0.2 | 0.2 | 0.2 |
| Evaluation | Actual Specific Gravity |  |  | 4.49 | 4.20 | 4.52 |
|  | Actual Specific Gravity/Theoretical Specific Gravity |  |  | 0.99 | 0.93 | 1.00 |
|  | Relative Magnetic Permeability | 1 MHz | Real Part μ' of Complex Magnetic Permeability | 90 | 81 | 80 |
|  |  |  | Imaginary Part μ'' of Complex Magnetic Permeability | 1 | 1 | 1 |
|  |  | 10 MHz | Real Part μ' of Complex Magnetic Permeability | 93 | 84 | 83 |
|  |  |  | Imaginary Part μ'' of Complex Magnetic Permeability | 3 | 3 | 3 |
|  | Presence or Absence of Gap |  |  | Excellent | Poor | Poor |
|  | Film-Forming Properties |  |  | Good | Good | Bad |

The numerical value of each of the components in Tables shows solid content. The numerical value of each of the components in Tables shows part(s) by mass, otherwise particularly specified. For Examples and the components in Tables, the details are described below.

Soft magnetic particles for low frequency: Fe—Si—Al alloy, flat, average particle size of 43 μm, average thickness of 1 μm, specific gravity of 6.8, coercive force in easy direction of magnetization of below 3 (Oe)

Soft magnetic particles for high frequency: Fe—Si—Al alloy, flat, coercive force in easy direction of magnetization of 3 (Oe) or more Cresol novolak epoxy resin: epoxy resin of the above-described formula (1), epoxy equivalent of 199 g/eq., ICI viscosity (at 150° C.) of 0.4 Pa·s, specific gravity of 1.21, trade name: "K1-3000-4", manufactured by Tohto Kasei Co., Ltd.

Trishydroxyphenylmethane epoxy resin: epoxy resin of the above-described formula (2), epoxy equivalent of 169 g/eq., ICI viscosity (at 150° C.) of 0.1 Pa·s, specific gravity of 1.25, trade name: "EPPN-501HY", manufactured by Nippon Kayaku Co., Ltd.

Bisphenol A epoxy resin: epoxy equivalent of 180 g/eq., ICI viscosity (at 150° C.) of 0.05 Pa·s, specific gravity of 1.15, trade name "Epikote YL980", manufactured by Mitsubishi Chemical Corporation Phenol biphenylene resin: phenol resin of the above-described formula (4), hydroxyl equivalent of 203 g/eq., ICI viscosity (at 150° C.) of 0.05 Pa·s, specific gravity of 1.18, trade name "MEH-7851SS", manufactured by Meiwa Plastic Industries, Ltd.

Phenol novolak resin: phenol resin of the above-described formula (3), hydroxyl equivalent of 104 g/eq., ICI viscosity (at 150° C.) of 0.03 Pa·s, specific gravity of 1.2, trade name: "RESITOP LVR8210DL", manufactured by Gunei Chemical Industry Co., Ltd.

Acrylic resin: ethyl acrylate-butyl acrylate-acrylonitrile copolymer modified with carboxy group and hydroxy group, weight average molecular weight of 900,000, specific gravity of 1.00, trade name: "TEISANRESIN SG-70L" (resin content ratio of 12.5 mass %), manufactured by Nagase Chemtex Corporation Thermosetting catalyst: 2-phenyl-1H-imidazole 4,5-dimethanol, specific gravity of 1.33, trade name: "CUREZOL 2-PHZ-PW", manufactured by Shikoku Chemicals Corporation Dispersant: polyether phosphate ester, acid value of 17, specific gravity of 1.03, trade name: "HIPLAAD ED152", manufactured by Kusumoto Chemicals, Ltd.

Rheology control agent: urea-modified intermediate polarity polyamide, specific gravity of 0.86, trade name: "BYK430" (solid content of 30 mass %), manufactured by BYK Japan KK While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

INDUSTRIAL APPLICABILITY

The soft magnetic resin composition and the soft magnetic film of the present invention can be applied in various industrial products and, for example, can be used for smartphones, personal computers, and position detection devices and for coil modules for wireless communications or wireless power transmission.

DESCRIPTION OF REFERENCE NUMERALS

4 Soft magnetic film
7 Soft magnetic particles

The invention claimed is:
1. A soft magnetic resin composition comprising:
flat soft magnetic particles, and a resin component containing an epoxy resin, a phenol resin, and an acrylic resin, wherein
the epoxy resin consists of only an epoxy resin having three or more functional groups,
the phenol resin consists of only a phenol resin having three or more functional groups,
the epoxy resin having the three or more functional groups is a cresol novolak epoxy resin, and the phenol resin having the three or more functional groups is a phenol biphenylene resin, and the content ratio of the acrylic resin in the resin component is 25 mass % or more.

2. The soft magnetic resin composition according to claim 1, wherein
the total content of the epoxy resin and the phenol resin with respect to 100 parts by mass of the soft magnetic particle-excluding component excluding the soft magnetic particles is 20 parts by mass or more and 60 parts by mass or less.

3. The soft magnetic resin composition according to claim 1, wherein
the epoxy equivalent of the epoxy resin is 230 g/eq. or less and
the hydroxyl equivalent of the phenol resin is 230 g/eq. or less.

4. The soft magnetic resin composition according to claim 1, wherein
the content ratio of the soft magnetic particles is 40% by volume or more.

5. A soft magnetic film obtained by curing the soft magnetic resin composition by heating according to claim 1.

6. A soft magnetic resin composition comprising:
flat soft magnetic particles, and a resin component containing an epoxy resin, a phenol resin, and an acrylic resin, wherein
the epoxy resin consists of only an epoxy resin having three or more functional groups,
the phenol resin consists of only a phenol resin having three or more functional groups,
the epoxy equivalent of the epoxy resin is 230 g/eq. or less,
the hydroxyl equivalent of the phenol resin is 230 g/eq. or less,
the epoxy resin having the three or more functional groups is a trishydroxyphenylmethane epoxy resin, and the phenol resin having the three or more functional groups is a phenol novolak resin, or
the epoxy resin having the three or more functional groups is a cresol novolak epoxy resin, and the phenol resin having the three or more functional groups is a phenol biphenylene resin, and
the content ratio of the acrylic resin in the resin component is 25 mass % or more.

7. The soft magnetic resin composition according to claim 6, wherein the total content of the epoxy resin and the phenol resin with respect to 100 parts by mass of the soft magnetic particle-excluding component excluding the soft magnetic particles is 20 parts by mass or more and 60 parts by mass or less.

8. The soft magnetic resin composition according to claim 6, wherein the content ratio of the soft magnetic particles is 40% by volume or more.

9. A soft magnetic film obtained by curing the soft magnetic resin composition by heating according to claim 6.

* * * * *